(12) United States Patent
Duan et al.

(10) Patent No.: US 11,437,744 B2
(45) Date of Patent: Sep. 6, 2022

(54) PRINTED CIRCUIT BOARD ASSEMBLY

(71) Applicant: Telefonaktiebolaget LM Ericsson (publ), Stockholm (SE)

(72) Inventors: Pinghua Duan, Nanjing (CN); Zhen Yang, Nanjing (CN); Haiquan Gu, Nanjing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 17/262,728

(22) PCT Filed: Aug. 1, 2018

(86) PCT No.: PCT/CN2018/098073
§ 371 (c)(1),
(2) Date: Jan. 24, 2021

(87) PCT Pub. No.: WO2020/024161
PCT Pub. Date: Feb. 6, 2020

(65) Prior Publication Data
US 2021/0194161 A1    Jun. 24, 2021

(51) Int. Cl.
| | |
|---|---|
| *H01R 12/71* | (2011.01) |
| *H01R 13/15* | (2006.01) |
| *H01R 12/73* | (2011.01) |
| *H01R 13/24* | (2006.01) |
| *H05K 7/14* | (2006.01) |

(52) U.S. Cl.
CPC .......... *H01R 12/714* (2013.01); *H01R 12/73* (2013.01); *H01R 13/15* (2013.01); *H01R 13/2407* (2013.01); *H05K 7/1435* (2013.01)

(58) Field of Classification Search
CPC ............... H01R 12/714; H01R 12/187; G01R 1/06722; H05K 1/14
See application file for complete search history.

(56) References Cited

U.S. PATENT DOCUMENTS

| | | | |
|---|---|---|---|
| 5,366,380 A | 11/1994 | Reymond | |
| 5,641,315 A * | 6/1997 | Swart | ............... G01R 1/06722 324/72.5 |
| 6,340,320 B1 * | 1/2002 | Ogawa | ............... H01R 13/2421 29/511 |

(Continued)

FOREIGN PATENT DOCUMENTS

| | | |
|---|---|---|
| CN | 201285839 Y | 8/2009 |
| CN | 105556754 A | 5/2016 |

(Continued)

OTHER PUBLICATIONS

International Search Report and Written Opinion of the International Searching Authority, PCT/CN2018/098073, completed Apr. 10, 2019, 10 pages.

*Primary Examiner* — Vanessa Girardi
(74) *Attorney, Agent, or Firm* — Sage Patent Group

(57) ABSTRACT

A board connector used in a printed circuit board assembly and includes a shell, a pin and an elastic member. The shell has a chamber therein and a hole on a surface thereof. The pin is configured to accommodate in the chamber, wherein at least one part of the pin protrudes out of the shell via the hole. The elastic member is configured to locate in the chamber. The pin is located between the surface of the shell and the elastic member.

12 Claims, 10 Drawing Sheets

(56) References Cited

U.S. PATENT DOCUMENTS

| | | | | |
|---|---|---|---|---|
| 7,220,134 | B2* | 5/2007 | Goodman | H01R 13/2421 439/70 |
| 7,458,818 | B2* | 12/2008 | Kiyofuji | G01R 1/07371 324/750.07 |
| 7,585,194 | B2* | 9/2009 | Ito | H04M 1/0262 439/824 |
| 7,692,508 | B2* | 4/2010 | Quan | H01P 5/107 333/1 |
| 7,726,979 | B2 | 6/2010 | Lei et al. | |
| 9,634,415 | B2 | 4/2017 | Ye et al. | |
| 2008/0144301 | A1 | 6/2008 | Konishi | |

FOREIGN PATENT DOCUMENTS

| | | |
|---|---|---|
| CN | 206135004 U | 4/2017 |
| CN | 107706565 A | 2/2018 |

\* cited by examiner

PRINTED CIRCUIT BOARD ASSEMBLY

CROSS REFERENCE TO RELATED APPLICATION

This application is a 35 U.S.C. § 371 national stage application of PCT International Application No. PCT/CN2018/098073 filed on Aug. 1, 2018, the disclosure of which is incorporated by reference herein in its entirety.

TECHNICAL FIELD

The present disclosure generally relates to a technical field of electronic products, and more particularly to a printed circuit board assembly having a board connector.

BACKGROUND

Currently, as for electronic products (for example especially for communication electronic products), it is common to use a board connector to connect two electronic products. In one example, a board-to-board connector is used to connect a motherboard and a sub-board, in order to transmit signals in the relevant industry.

As shown in FIG. 1, it shows an assembly including a motherboard 20, a sub-board 30 and a board-to-board connector 10'. Specifically, the board-to-board connector 10' is located between the motherboard 20 and the sub-board 30, and connects them. That is, there is a hard contact formed between the motherboard 20 and the sub-board 30 by means of the board-to-board connector 10'. The board-to-board connector 10' is a gold finger in one example.

However, when multiple hard contacts are disposed at the same time, due to non-consistency to some degrees, some individual contacts might be bad or not so good. Further, due to a tolerance gap between contact surfaces of the motherboard and the sub-board, in this method, the sub-board is pressed down and deformed to compensate the tolerance gap. But, such deformation would cause some sensitive components located between the boards break down, or even result in failure.

SUMMARY

Various embodiments described herein provide a board connector and a printed circuit board assembly, respectively.

In accordance with one aspect of the present application, a board connector in a printed circuit board assembly includes:

a shell, having a chamber therein and a hole on a surface thereof;

a pin, configured to accommodate in the chamber, wherein at least one part of the pin protrudes out of the shell via the hole;

an elastic member, configured to locate in the chamber, wherein the pin is located between the surface and the elastic member.

In some embodiments, the pin has a head which is capable of protruding out of the shell via the hole, and a cylindrical body on which the head is located on.

In some embodiments, the shell is a hollow cylinder made of metal, and the pin is also made of metal.

In some embodiments, the head and the cylindrical body are integrally formed.

In some embodiments, the elastic member comprises at least one shrapnel so that contraction and expansion of the at least one shrapnel enable the pin to move back and forth along the hole.

In some embodiments, a plurality of the shrapnels among the at least one shrapnels are uniformly distributed along an inner periphery of the shell.

In some embodiments, the elastic member comprises a spring.

In some embodiments, the pin has a recess on one end facing away the head, one end of the spring is housed within the recess and the other end of the spring is supported on the shell, so that contraction and expansion of the spring enable the pin to move back and forth along the hole.

In some embodiments, at least one arc edge is provided to entirely or partially extend on an outer surface of the shell along an axial direction of the shell.

In some embodiments, the at least one arc edge extends entirely on the outer surface along the axial direction of the shell with a constant thickness.

In some embodiments, the at least one arc edge extends entirely on the outer surface along the axial direction of the shell with a thickness gradually increasing from either end of the at least one arc edge to a middle part of the outer surface or with a larger thickness at the middle part of the outer surface.

In some embodiments, the at least one arc edge comprises at least two arc edges equally spaced apart on the outer surface.

In some embodiments, the at least one arc edge is in a shape of square, triangle, ellipse, semi-circle or circle in a cross section view thereof.

In accordance with another aspect of the present invention, a printed circuit board assembly includes:

a motherboard, comprising at least one through-hole therein;

a sub-board, comprising at least one contacting pad; and at least one board connector as described above, wherein the at least one board connector is pressed into a corresponding one of the least one through-hole and the at least part of the pin is electrically connected with a corresponding one of the at least one contacting pad.

In some embodiments, the at least one through-hole is plated with metal for electrically connecting the motherboard and the at least one board connector.

BRIEF DESCRIPTION OF THE DRAWINGS

These aspects and/or other aspects as well as advantages of the present application will become obvious and readily understood from the description of the preferred embodiments of the present application in conjunction with the accompanying drawings below, in which.

DETAILED DESCRIPTION OF EMBODIMENTS

In the discussion that follows, specific details of particular embodiments of the present techniques are set forth for purposes of explanation and not limitation. It will be appreciated by those skilled in the art that other embodiments may be employed apart from these specific details.

Furthermore, in some instances detailed descriptions of well-known methods, structures, and devices are omitted so as not to obscure the description with unnecessary detail.

Figure 2:
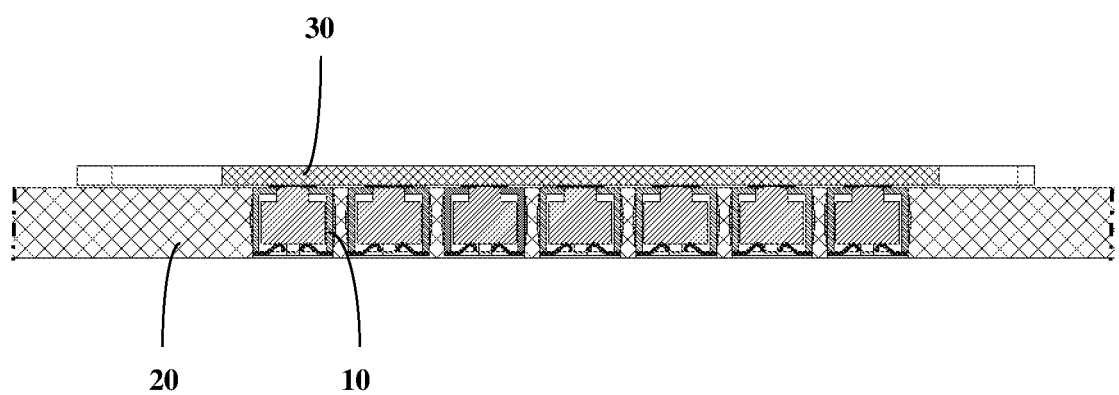
FIG. 2 is a schematic view of a printed circuit board assembly in accordance with an embodiment of the present invention.

With reference to FIG. 2, it shows a schematic view of a printed circuit board assembly 100. The printed circuit board assembly 100 typically includes three main components, for example a motherboard 20, a sub-board 30 and at least one board connector 10. Of course, in practice, it can also include any other necessary components, not limiting to the above mentioned three components.

Figure 3A:
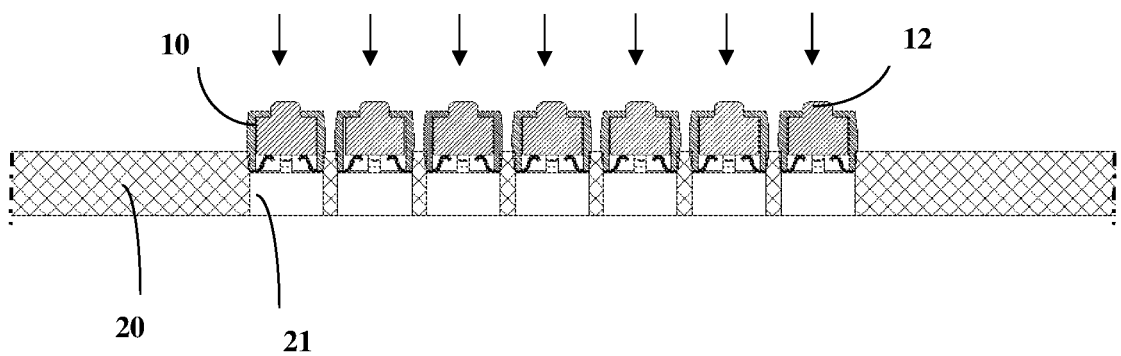
FIGS. 3A-3C show processes of installing a sub-board into a motherboard of the printed circuit board assembly as shown in FIG. 2.
Figure 3B:
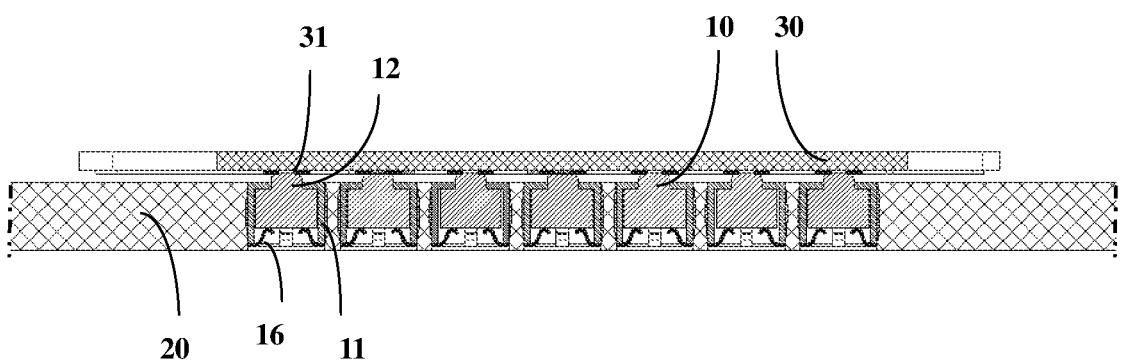
Figure 3C:
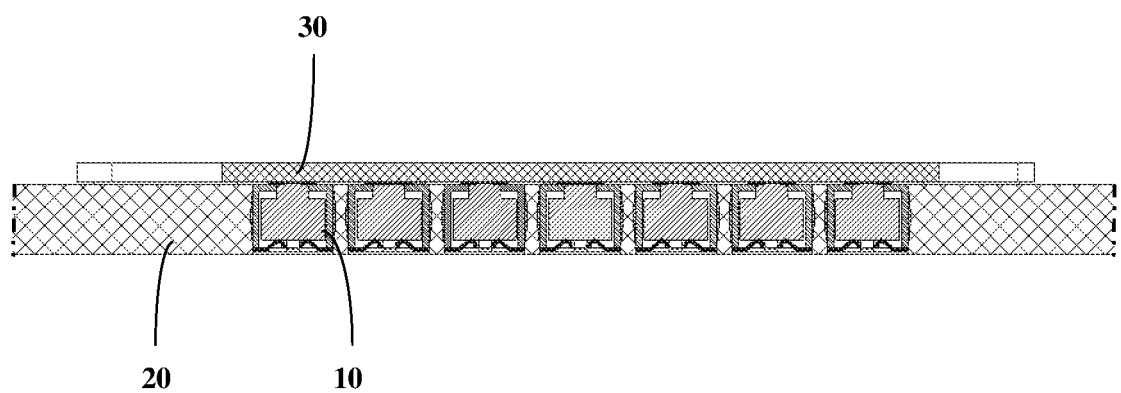

In combination with FIGS. 3A-3C, the motherboard 20 comprises at least one through-hole 21 therein. As illustrated, the motherboard 20 has 7 through-holes 21 therein. Of course, the number and/or size of the through-holes 21 can be chosen, and the positions thus the distances of those through-holes 21 as actually required, and not limited to 7 or the shown size. It should be realized that except the through-hole 21, the motherboard would include other necessary components, which are omitted herein for sake of not obscuring the inventive point of the present invention.

As shown in FIG. 3B, the sub-board 30 comprises at least one contacting pad 31. As illustrated, the sub-board 30 has 7 contacting pads 31. It is apparent that the number and/or size of the contacting pads 31 can normally correspond with that or those of the through-holes 21. Similarly, the number and/or size of the contacting pads 31 can be chosen as actually required, and is limited to 7 or the shown size. It should also be realized that except the contacting pad 31, the sub-board would include other necessary components, which are omitted herein for sake of not obscuring the inventive point of the present invention.

As shown in FIGS. 3A-3C, they illustrate 7 board connectors 10 used to connect the motherboard 20 and the sub-board 30. All the board connectors 10 are pressed down into correspond ones of the through-holes 21 and the at least part of a pin 11 of each board connector 10 is electrically connected with a corresponding one of the contacting pads 31. Signal communication between the motherboard 20 and the sub-board 30 can be achieved by the electrical connection therebetween.

It should be noted that the board connector 10 can also connect other electronic products, for example other boards, cables, connectors or the like. The motherboard and the sub-board herein are taken only as one illustrative example.

During installing processes to form the printed circuit board assembly 100, firstly as shown in FIG. 3A, board connectors 10 are placed correspondingly into the through-holes 21 in a motherboard 20, along a direction indicated by arrows until the board connectors 10 all are housed within the corresponding through-holes. In this way, the board connectors 10 are cooperated with the mother board 20 by means of interference fit. After completely placing them into the through-holes 21, a sub-board 10 is disposed onto a surface (for example a front surface as shown) of the motherboard 20 while the contacting pads 31 thereon contact heads 12 of pins 11 in the board connectors 10 in one-to-one correspondence, as shown in FIG. 3B. As shown in FIG. 3C, after that, the sub-board 30 is pressed down so that a gap between the motherboard 20 and the sub-board 30 is reduced as predetermined. Because the board connectors 10 each further includes an elastic member 16, the board connectors 10 can function as one kind of elastic structures. With such arrangement, it can compensate tolerance gaps between the motherboard 20 and the sub-board 30 at multipoint contacts, and improve reliability of contacting with each other at the multipoint contacts.

That is, after all the assembling processes are finished, all the pins 12 of the board connectors 10 have been compressed, the amount of compression can compensate the tolerance gap, and then improve or guarantee the reliability of the signal connection.

Figure 1:
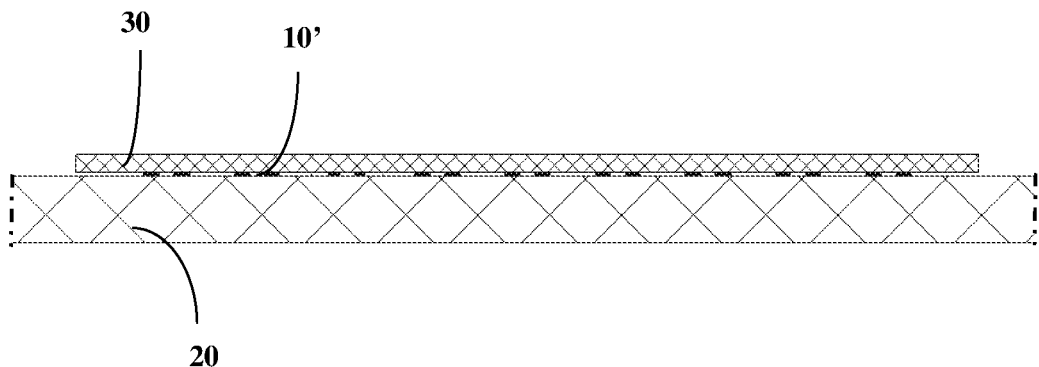
FIG. 1 is a schematic view of a motherboard and a sub-board when they are connected by a board-to-board connector.

The specific structures about the board connector 10 will be explained in more detail below. Since the board connector 10 can be pressed down to be mostly or entirely accommodated into the through-holes 21, so that this connection technology or the resulting printed circuit board assembly 100 is considered as an embedded design or an embedded single connection technology. This not only achieves the signal connection therebetween, but also saves more space and has higher reliability at the multipoint contacts as compared with that shown in FIG. 1.

In this printed circuit board assembly 100, signals are transmitted to the pins 11 of the board connectors 10 from the sub-board 30, and then to the through-holes 21 of the motherboard 20, therefore, the signals can be transmitted from the sub-board 30 to the motherboard 20. As such, the signals can also be transmitted from the mother-board 20 to the sub-board 30 along a reverse transmission path to the above mentioned. It should be noted that the pins 11 and the through-holes 21 should be conductive in terms of signal communication. For example, the pins 11 can be made of conductive materials, such as cooper (Cu), Ag (silver), Au (gold) or other suitable materials, while the through-holes 21 can be plated with such conductive materials, for example Cu, Ag or some alloy.

In the present board connector 10, the pin 11 is connected with a shell 1 of the board connector 10 and the shell 1 is in turn connected with the through-hole 21.

Figure 4A:
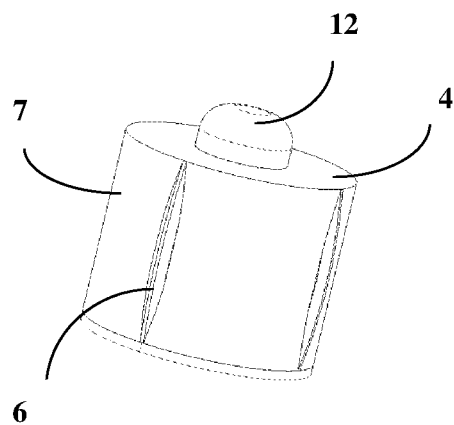
FIGS. 4A and 4B are respectively a schematic view of a board connector having shrapnels as shown in FIG. 2 and FIG. 3C, and a cross sectional view thereof.
Figure 4B:
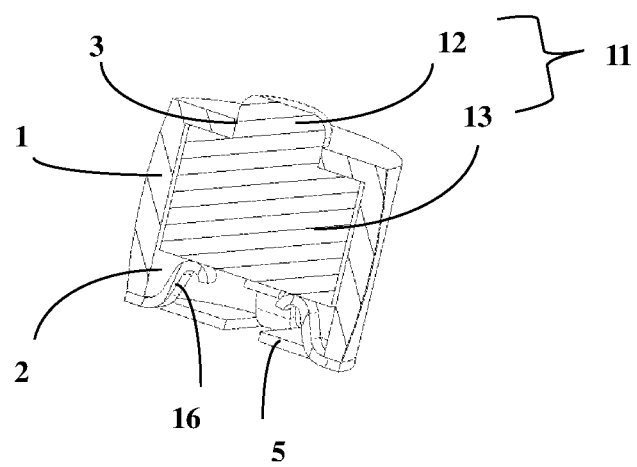

FIGS. 4A and 4B show specific structures of the board connector 10 in accordance with an embodiment of the present invention, in a prospective view and a cross-sectional view respectively.

The board connector 10 includes a shell 1, a pin 11 and an elastic member 16. In one example, the shell 1 has a chamber 2 therein and a hole 3 on a surface 4 thereof. The pin 11 is placed to accommodate in the chamber 2, and a part of the pin 11 is necessary to connect with the object to be connected (for example the sub-board 30 in this example), so the head 12 is designed to protrude out of the shell 1 via the hole 3. As clearly seen from FIG. 4B, the head 12 protrudes out through an upper surface 4 of the shell 1 via the hole 3 therein. The head 12 is located on a body 13 of the pin 11. The head 12 has a smaller cross-sectional area than that of a body 13 of the pin 11. In this way, a step or at least one step is formed at an interface for connecting the head 12 and the body 13, and thereby it can prevent the whole of the pin 11 from falling out.

The pin 11 is located between the surface 4 and the elastic member 16. As shown, the elastic member 16 in the example is located in the chamber 2, specifically opposite to the head 12 and under the body 13. Although the elastic member 16 or a shrapnel 16 rests on a lower surface 5 opposite to the surface 4, it is not limiting to this and can rest on an inner wall of the shell 1. That is, as long as the elastic member 16 can function properly, it is not intended to limit the specific installing way of the elastic member 16.

Further, due to provision of the elastic member 16, the head 12 is capable of protruding out of the shell 1 via the hole 3 or retracting back into the shell 1 via the hole 3. In the present example, when it is a normal state, the head 12 is designed to protrude out of the shell 1; when it is in use or in an assembled state, the head 12 retracts back due to the contact with the object to be connected, for example the sub-board 30.

As shown, the shell 1 is illustrated as one hollow cylinder, so the body 13 is also designed to be cylindrical. Of course, the body 13 can also be designed into other forms, such as to be sphere, cuboid or the like. In order to facilitate the manufacturing or the like, the shell 1 is correspondingly to be hollow sphere or cuboid. Alternatively, in some cases, the shell 1 is not necessary to correspond with the body 13 in terms of shape. In practice, the head 12 can be integrally formed on the body 13. Alternatively, the head 12 and the body 13 can be separate elements.

As discussed above, the elastic member 16 includes at least one shrapnel. By virtue of the contraction and expansion thereof, the pin 11 is enabled to move back and forth along the hole 3. As shown in FIGS. 4A and 4B, four shrapnels 16 are provided and uniformly distributed along an inner periphery of the shell 1. Alternatively, when there are several shrapnels 16, they can be non-uniformly distributed long the inner periphery of the shell 1.

Figure 4C:
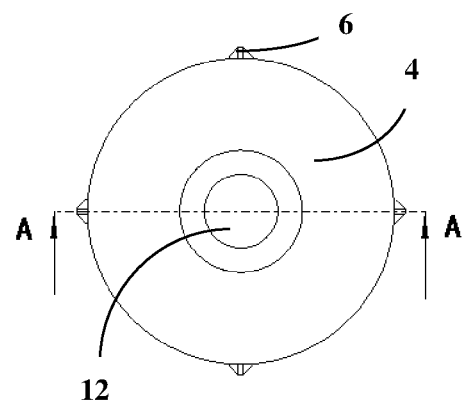
FIGS. 4C and 4D are respectively a top view of the board connector and a cross sectional view of the board connector cut along a line A-A, wherein the arc edge has a gradual thickness in the cross-sectional view.
Figure 4D:
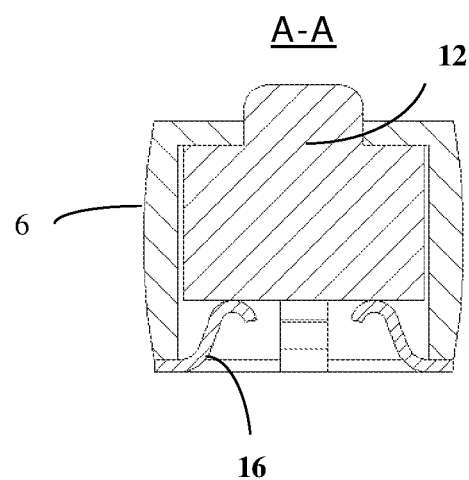
Figure 4E:
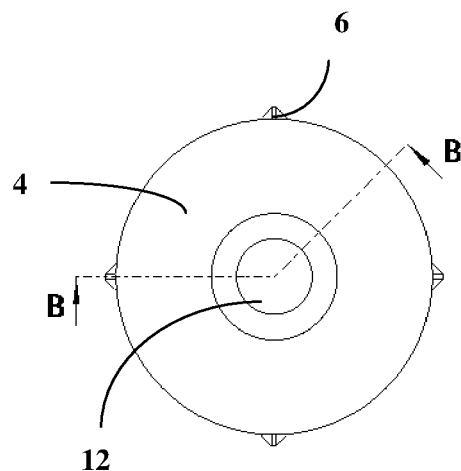
FIGS. 4E and 4F are respectively a top view of the board connector and a cross sectional view of the board connector cut along a line B-B, wherein the line B-B only passes through one arc edge.
Figure 4F:
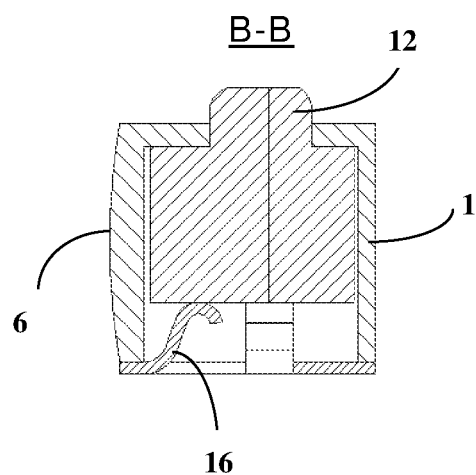

Furthermore, FIGS. 4C and 4D are respectively a top view of the board connector and a cross sectional view of the board connector cut along a line A-A. FIGS. 4E and 4F are respectively a top view of the board connector and a cross sectional view of the board connector cut along a line B-B. As can be clearly seen, the shell 1 has an outer surface 7. At least one arc edge 6 is provided to entirely or partially extend on an outer surface 7 of the shell 1 along an axial direction (i.e., a longitudinal direction) of the shell 1. At least the arc edge 6 of the shell 1 is necessary to be made of conductive materials. It should be noted that the line A-A passes through two opposite arc edges 6 whereas the line B-B only passes through one arc edge 6. We can see from the cross-sectional views FIGS. 4D and 4F that the arc edge 6 has a gradual thickness long the axial direction, and the wall of the shell 1 has a constant thickness. As shown, the thickness of the arc edge 6 is increased from either end thereof (i.e., a top end or a bottom end) to a middle part of the outer surface 7, or in other words, the larger thickness of the arc edge 6 is present at the middle part of the outer surface 7. The arc edge 6 is in a shape of square, triangle, ellipse, semi-circle or circle in a cross section view thereof.

As discussed below in detail, the thickness of the arc edge 6 can also have a constant thickness, and the wall of the shell 1 can have a variable thickness. They can be designed according to the actual requirements.

The above discussion involves in the example where the arc edge 6 can extend entirely or continuously from the upper surface 4 to the lower surface 5. Of course, the arc edge 6 can also only extend a part of the distance from the upper surface 4 to the lower surface 5, or discontinuously extend on the entire distance from the upper surface 4 to the lower surface 5. It should be appreciated that the arc edge 6 can be straight, inclined or wandering. In the present disclosure, for sake of convenience, the arc edge 6 only is shown to be straight.

In a case there are several arc edges 6, they can be equally or unequally spaced apart on the outer surface 7, or spaced apart with different predetermined distances.

Next, another variant of the board connector 10 is explained in detail with references to FIGS. 5A-6D.

Structural arrangements of FIGS. 5A-5F are similar to those of FIGS. 4A-4F, with the only difference that the elastic member is designed to be a spring 16'. Therefore, some of the explanations about the same components are also applicable for the embodiment of FIGS. 4A-4F, unless they are conflicted with each other.

Figure 5A:
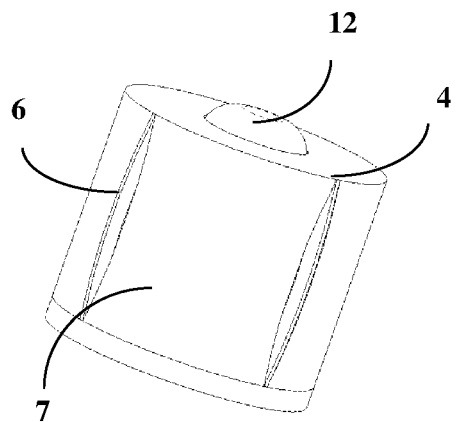
FIGS. 5A and 5B are respectively a schematic view of a board connector having a spring as shown in FIG. 2 and FIG. 3C, and a cross sectional view thereof.
Figure 5B:
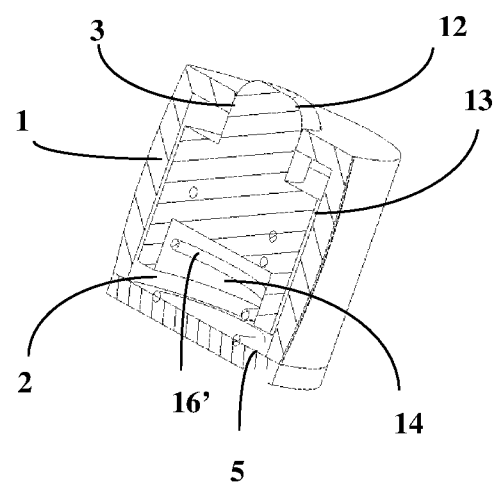

FIGS. 5A and 5B are respectively a schematic view of a board connector having a spring as shown in FIG. 2 and a cross sectional view thereof. In this example, the elastic member is a spring 16'. In order to accommodate the spring 16', the pin 11 has a recess 4 on one end facing away the head 12. One end of the spring 16' is housed within the recess 4 at a bottom end of the body 13, and the other end thereof is supported on the shell 1, particularly, on the lower surface 5 of the shell 1. With such arrangement, by virtue of contraction and expansion of the spring 16', the pin 11 can move back and forth along the hole 3.

It should be understood that the spring 16' can also support on the bottom surface of the body 13 directly without the recess. That is, as long as the spring 16' can function as the elastic member, it is not intended to limit the specific supporting way thereof.

Figure 5C:
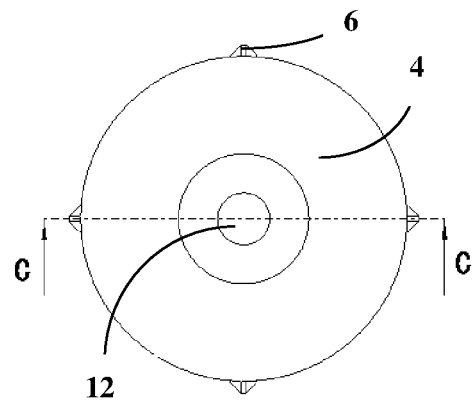
FIGS. 5C and 5D are respectively a top view of the board connector and a cross sectional view of the board connector cut along a line C-C, wherein the arc edge has a gradual thickness in the cross-sectional view.
Figure 5D:
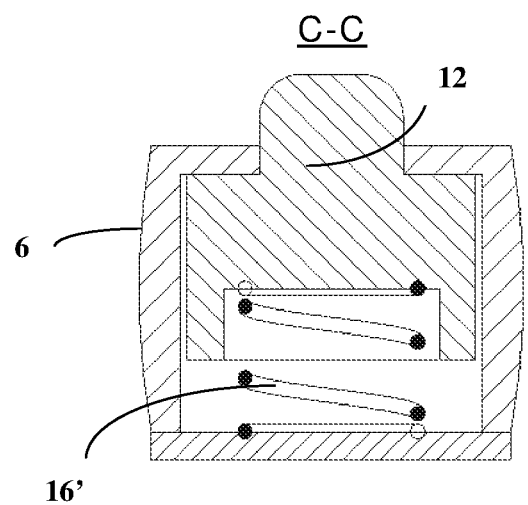
Figure 5E:
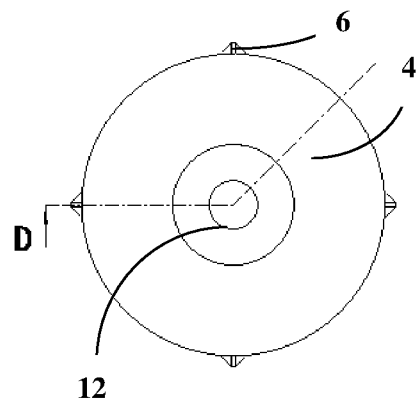
FIGS. 5E and 5F are respectively a top view of the board connector and a cross sectional view of the board connector cut along a line D-D, wherein the line D-D only passes through one arc edge.
Figure 5F:
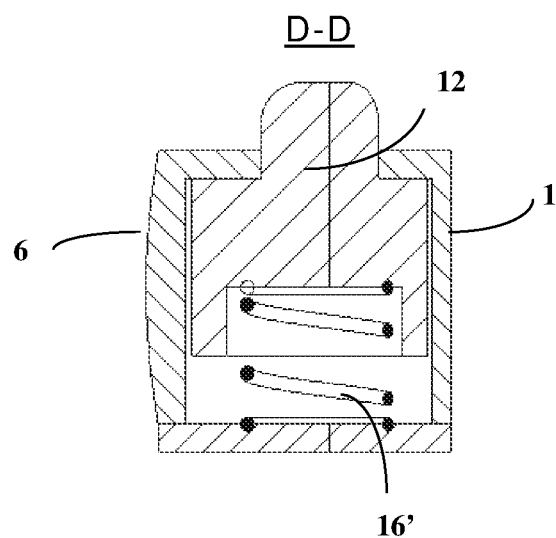

Furthermore, FIGS. 5C and 5D are respectively a top view of the board connector and a cross sectional view of the board connector cut along a line C-C. FIGS. 5E and 5F are respectively a top view of the board connector and a cross sectional view of the board connector cut along a line D-D. As can be clearly seen, the shell 1 has an outer surface 7. At least one arc edge 6 is provided to entirely or partially extend on an outer surface 7 of the shell 1 along an axial direction (i.e., a longitudinal direction) of the shell 1. At least the arc edge 6 of the shell 1 is necessary to be made of conductive materials. It should be noted that the line C-C passes through two opposite arc edges 6 whereas the line D-D only passes through one arc edge 6. We can see from the cross-sectional views FIGS. 5D and 5F that the arc edge 6 has a gradual thickness long the axial direction, and the wall of the shell 1 has a constant thickness. As shown, the thickness of the arc edge 6 is increased from either end thereof (i.e., a top end or a bottom end) to a middle part of the outer surface 7, or in other words, the larger thickness of the arc edge 6 is present at the middle part of the outer surface 7.

As discussed below in detail, the thickness of the arc edge 6 can also have a constant thickness, and the wall of the shell 1 can have a variable thickness. They can be designed according to the actual requirements.

The above discussion involves in the example where the arc edge 6 can extend entirely or continuously from the upper surface 4 to the lower surface 5. The arc edge 6 can also only extend a part of the distance from the upper surface 4 to the lower surface 5, or discontinuously extend on the entire distance from the upper surface 4 to the lower surface 5. It should be appreciated that the arc edge 6 can be straight, inclined or wandering. In the present disclosure, for sake of convenience, the arc edge 6 only is shown to be straight.

In a case there are several arc edges 6, they can be equally or unequally spaced apart on the outer surface 7, or spaced apart with predetermined different distances.

The arc edge 6 is in a shape of square, triangle, ellipse, semi-circle or circle in a cross section view thereof, as shown in FIGS. 6A-6D respectively.

Figure 6A:
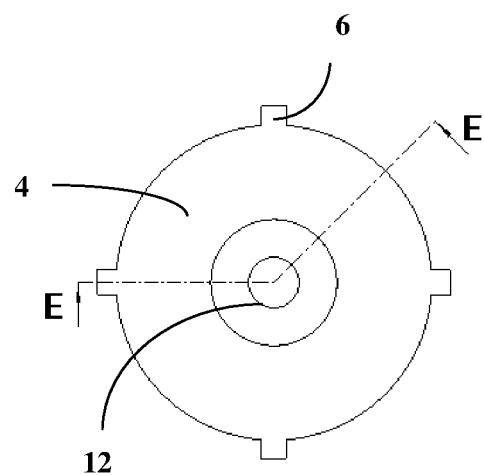
FIGS. 6A and 6B are respectively a top view of another example of the board connector having the spring and a cross sectional view of the board connector cut along a line E-E, wherein the arc edge has a rectangular shape in the top view with a constant thickness.
Figure 6B:
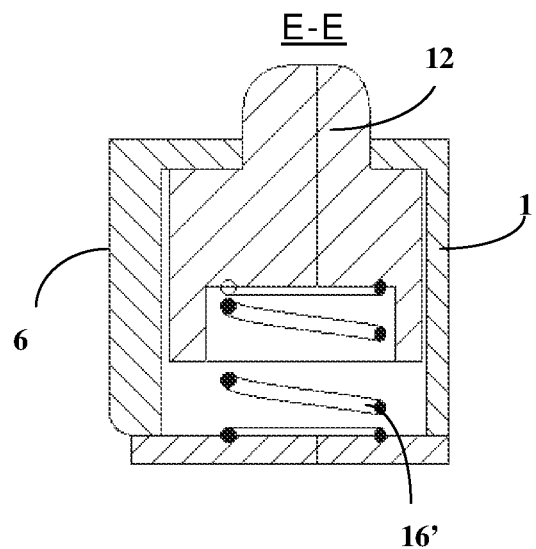

FIGS. 6A and 6B are respectively a top view of another example of the board connector having the spring and a cross sectional view of the board connector cut along a line E-E. In this case, the arc edge 6 has a rectangular shape in the top view. It is observed that it has a constant thickness along the axial direction on the entire distance from the upper surface 4 to the lower surface 5.

For course, the arc edge 6 is not limited to the rectangular shape, but it can have a semi-circular cross-sectional shape as discussed below. The arc edge 6 does not necessarily lie perpendicular to the direction which the board connector being pushed into the through-hole 11, as shown in those figures, for example, it can be sloping on the surface 7 of the shell 1.

Figure 6C:
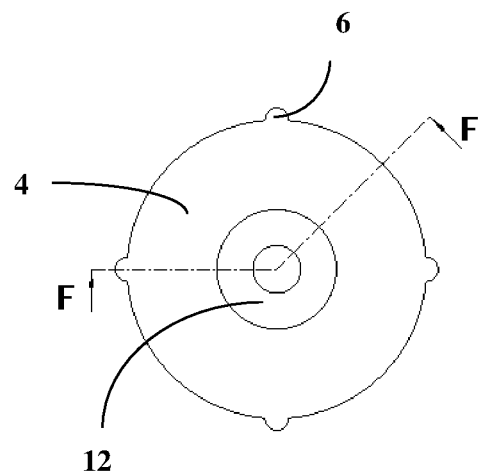
FIGS. 6C and 6D are respectively a top view of a further example of the board connector having the spring and a cross sectional view of the board connector cut along a line F-F, wherein the arc edge has a semi-circular shape in the top view with a constant thickness.
Figure 6D:
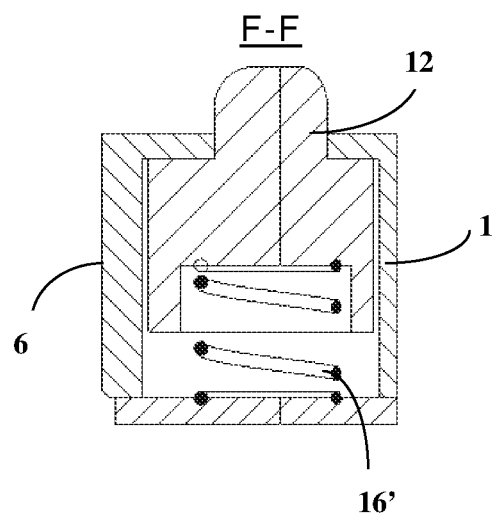

FIGS. 6C and 6D are respectively a top view of a further example of the board connector having the spring and a cross sectional view of the board connector cut along a line F-F. In this example, the arc edge 6 has a semi-circular shape in the top view. It is observed that it has a constant thickness along the axial direction on the entire distance from the upper surface 4 to the lower surface 5. Alternatively, the arc edge 6 can also be inclined with respect to a line perpendicular to the upper surface 4 or the lower surface 5.

In other examples, the cross-sectional shape could be any other sector with different angles, for example in a range from 0° to 360°.

It should be noted that although the elastic member can be the shrapnel or the spring, it is not limited to this and could be any other suitable elastic structural arrangement.

In accordance with at least one embodiment or examples of the board connectors or the printed circuit board assembly of the present invention, it adopts the embedded signal connection technology, to press the board connector down into the through-hole of the motherboard. In this way, it can save the area of the top surface of the motherboard and reduce the product volume or height of the printed circuit board assembly.

At least in some embodiments or examples of the present invention, due to this type of the elastic member, the tolerance gap of the processing, assembly and deformation can be compensated. As a consequence, the reliability of connections at the multipoint contacts is improved.

In addition, due to the embedded signal connection technology, the board connector can be assembled before SMA, thus the elastic board connecter would not affect the SMA process, such as screen printing. In some cases, it is feasible to assembly them after the SMA process.

The present disclosure is described above with reference to the embodiments thereof. However, those embodiments are provided just for illustrative purpose, rather than limiting the present disclosure. The scope of the disclosure is defined by the attached claims as well as equivalents thereof. Those skilled in the art can make various alternations and modifications without departing from the scope of the disclosure, which all fall into the scope of the disclosure.

What is claimed is:

1. A printed circuit board assembly, comprising:
    a mother board, comprising at least one through-hole therein;
    a sub-board, comprising at least one contacting pad; and
    at least one board connector being pressed into a corresponding one of the least one through-hole, the board connector comprising:
        a shell, having an upper surface, a lower surface opposite the upper surface, a chamber therein and a hole on the upper surface;
        a pin, configured to accommodate in the chamber, wherein at least part of the pin protrudes out of the shell via the hole; and
        an elastic member, configured to locate in the chamber and contact against the pin and the lower surface and push the at least part of the pin protruding out of the shell;
        wherein the elastic member comprises a plurality of shrapnel springs, the plurality of shrapnel springs are distributed along an inner periphery of the shell, and contraction and expansion of the at least one shrapnel spring enables the pin to move back and forth along the hole;
        wherein the at least part of the pin is electrically connected with a corresponding one of the at least one contacting pad.

2. The printed circuit board assembly according to claim 1, wherein
    the at least one through-hole is plated with metal for electrically connecting the mother board and the at least one board connector.

3. The printed circuit board assembly according to claim 1, wherein
    the pin has a head which is capable of protruding out of the shell via the hole, and a cylindrical body on which the head is located on.

4. The printed circuit board assembly according to claim 1, wherein
    the elastic member comprises a spring; and wherein
    the pin has a recess on one end facing away the head, one end of the spring is housed within the recess and the other end of the spring is supported on the shell, so that contraction and expansion of the spring enable the pin to move back and forth along the hole.

5. The printed circuit board assembly according to claim 4, wherein
    at least one arc edge is provided to entirely or partially extend on an outer surface of the shell along an axial direction of the shell.

6. The printed circuit board assembly according to claim 5, wherein
the at least one arc edge extends entirely on the outer surface along the axial direction of the shell with a constant thickness.

7. The printed circuit board assembly according to claim 5, wherein
the at least one arc edge extends entirely on the outer surface along the axial direction of the shell with a thickness gradually increasing from either end of the at least one arc edge to a middle part of the outer surface or with a larger thickness at the middle part of the outer surface.

8. The printed circuit board assembly according to claim 1, wherein
the plurality of shrapnel springs are non-uniformly distributed along the inner periphery of the shell.

9. The printed circuit board assembly according to claim 1, wherein
the plurality of shrapnel springs are uniformly distributed along the inner periphery of the shell.

10. The printed circuit board assembly according to claim 8, wherein
at least one arc edge is provided to entirely or partially extend on an outer surface of the shell along an axial direction of the shell.

11. The printed circuit board assembly according to claim 10, wherein
the at least one arc edge extends entirely on the outer surface along the axial direction of the shell with a constant thickness.

12. The printed circuit board assembly according to claim 10, wherein
the at least one arc edge extends entirely on the outer surface along the axial direction of the shell with a thickness gradually increasing from either end of the at least one arc edge to a middle part of the outer surface or with a larger thickness at the middle part of the outer surface.

* * * * *